United States Patent
Tada et al.

(10) Patent No.: US 9,893,239 B2
(45) Date of Patent: Feb. 13, 2018

(54) METHOD OF MANUFACTURING LIGHT EMITTING DEVICE

(71) Applicant: NICHIA CORPORATION, Anan-shi, Tokushima (JP)

(72) Inventors: Takaaki Tada, Itano-gun (JP); Takayoshi Wakaki, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/371,888

(22) Filed: Dec. 7, 2016

(65) Prior Publication Data
US 2017/0162752 A1  Jun. 8, 2017

(30) Foreign Application Priority Data

Dec. 8, 2015  (JP) .................................. 2015-239332
Nov. 16, 2016  (JP) .................................. 2016-223139

(51) Int. Cl.
*H01L 33/00* (2010.01)
*H01L 33/44* (2010.01)
*H01L 33/58* (2010.01)

(52) U.S. Cl.
CPC ............ *H01L 33/44* (2013.01); *H01L 33/005* (2013.01); *H01L 33/58* (2013.01); *H01L 2933/0025* (2013.01); *H01L 2933/0058* (2013.01)

(58) Field of Classification Search
CPC ....... H01L 33/44; H01L 33/005; H01L 33/58; H01L 2933/0025; H01L 2933/0058
See application file for complete search history.

(56) References Cited

U.S. PATENT DOCUMENTS

| 7,655,157 | B2 * | 2/2010 | Cheng .................. C09K 11/682 |
| | | | 250/361 R |
| 2003/0141506 | A1 | 7/2003 | Sano et al. |
| 2004/0104390 | A1 | 6/2004 | Sano et al. |
| 2005/0035364 | A1 | 2/2005 | Sano et al. |
| 2005/0211993 | A1 | 9/2005 | Sano et al. |
| 2011/0057239 | A1 | 3/2011 | Arao |
| 2012/0177903 | A1 | 7/2012 | Sneck et al. |
| 2012/0326178 | A1 | 12/2012 | Fehrer et al. |
| 2013/0181236 | A1 | 7/2013 | Tamaki et al. |

(Continued)

FOREIGN PATENT DOCUMENTS

| JP | 2005-203604 A | 7/2005 |
| JP | 2011-060825 A | 3/2011 |

(Continued)

*Primary Examiner* — Yosef Gebreyesus
(74) *Attorney, Agent, or Firm* — Foley & Lardner LLP

(57) ABSTRACT

A method of manufacturing a light emitting device includes providing a light emitting element; and forming a protective film on a surface of the light emitting element, wherein the step of forming the protective film includes: (i) providing first quantity of oxygen at the surface of the light emitting element, (ii) combining a first quantity of a first metal with the first quantity of oxygen, (iii) combining a second quantity of oxygen with the first quantity of metal, (iv) combining a first quantity of a second metal, different from the first metal, with the second quantity of oxygen and first quantity of the first metal, and (v) combining a third quantity of oxygen with the first quantity of the second metal.

13 Claims, 8 Drawing Sheets

(56) References Cited

U.S. PATENT DOCUMENTS

| | | | |
|---|---|---|---|
| 2013/0240848 A1* | 9/2013 | Lin | H01L 51/52 257/40 |
| 2014/0034992 A1 | 2/2014 | Ichihara et al. | |
| 2015/0023026 A1 | 1/2015 | Sakamoto et al. | |

FOREIGN PATENT DOCUMENTS

| | | |
|---|---|---|
| JP | 2011-114240 A | 6/2011 |
| JP | 2013-504866 A | 2/2013 |
| JP | 2013-514642 A | 4/2013 |
| JP | 2013-143559 A | 7/2013 |
| JP | 2013-168547 A | 8/2013 |
| JP | 2013-254871 A | 12/2013 |
| JP | 2015-023081 A | 2/2015 |
| JP | 2015-061075 A | 3/2015 |
| WO | WO-03/065464 A1 | 8/2003 |
| WO | WO-2012/141031 A1 | 10/2012 |

* cited by examiner

METHOD OF MANUFACTURING LIGHT EMITTING DEVICE

CROSS-REFERENCE TO RELATED APPLICATIONS

This application claims priority to Japanese Patent Application No. 2015-239332 filed on Dec. 8, 2015, and Japanese Patent Application No. 2016-223139 filed on Nov. 16, 2016, which are hereby incorporated herein by reference in their entireties.

BACKGROUND

The present disclosure relates to a method of manufacturing a light emitting device.

A light emitting element including a nitride semiconductor layer (hereinafter also referred to as a "nitride semiconductor light emitting element") has a wide band gap, and is therefore capable of emitting, for example, ultraviolet light. In order to protect the nitride semiconductor layer, the nitride semiconductor light emitting element configured to emit ultraviolet light is covered by a protective film made of, for example, $SiO_2$ similarly to light emitting elements configured to emit light in other wavelength ranges (JP 2005-203604-A).

SUMMARY

The inventors of the present application have found a problem with typical nitride semiconductor light emitting elements—namely, that in accordance with increase in power output of nitride semiconductor light emitting elements, a semiconductor structure including a nitride semiconductor may be degraded by high-energy light and moisture (see FIG. 9). The inventors have determined that this problem should be solved in order to realize a high-power nitride semiconductor light emitting element.

Thus, an object of certain embodiments of the present invention is to provide a method of manufacturing a light emitting device in which degradation of a semiconductor structure including a nitride semiconductor can be reduced.

A method of manufacturing a light emitting device according to one embodiment of the present invention includes: providing a light emitting element; and forming a protective film on a surface of the light emitting element. In the step of providing the light emitting element, the light emitting element including a semiconductor structure in which an n-type semiconductor layer, an active layer, and a p-type semiconductor layer each containing a nitride semiconductor are layered in this order, a p-electrode partially formed on a surface of the p-type semiconductor layer on a side opposite to a surface provided with the active layer, and an n-electrode formed on a surface of the n-type semiconductor layer on a side opposite to a surface provided with the active layer in a region other than a region facing the p-electrode and having a peak wavelength of 410 nm or less. The step of forming the protective film includes: an A step of combining oxygen with a surface of the light emitting element using an oxygen raw material gas containing oxygen; a B step of combining a first metal with the oxygen combined with the surface of the light emitting element, the using a first metal raw material gas containing the first metal; a C step of combining oxygen with the first metal combined with the oxygen using an oxygen raw material gas containing oxygen; a D step of combining a second metal with the oxygen combined with the first metal using a second metal raw material gas containing the second metal that is different from the first metal; and an E step of combining oxygen with the second metal. In the step of forming of the protective film, the protective film is formed so as to continuously cover a surface of the n-electrode and a surface of the n-type semiconductor layer is formed.

Further, a light emitting device according to one embodiment of the present invention includes: a light emitting element including a semiconductor structure including an n-type semiconductor layer, an active layer, and a p-type semiconductor layer in this order each containing a nitride semiconductor, a p-electrode partially formed on a surface of the p-type semiconductor layer on a side opposite to a surface provided with the active layer, and an n-electrode formed on a surface of the n-type semiconductor layer on a side opposite to a surface provided with the active layer in a region other than a region facing the p-electrode and having a peak wavelength of 410 nm or less; and a protective film continuously covering a surface of the n-electrode and a surface of the n-type semiconductor layer. The protective film includes a first metal oxide film and a second metal oxide film that are alternately layered, the first metal oxide film containing a first metal, the second metal oxide film containing a second metal film. The first metal oxide film includes one or more single first metal oxide film. The second metal oxide film includes one or more single second metal oxide film.

With a method of manufacturing a light emitting device according to one embodiment of the present invention, a light emitting device can be manufactured in which degradation of a semiconductor structure containing a nitride semiconductor can be reduced.

Further, with a light emitting device according to certain embodiments of the present invention, a light emitting device can be provided in which degradation of a semiconductor structure containing a nitride semiconductor can be reduced.

DETAILED DESCRIPTION

Figure 1:
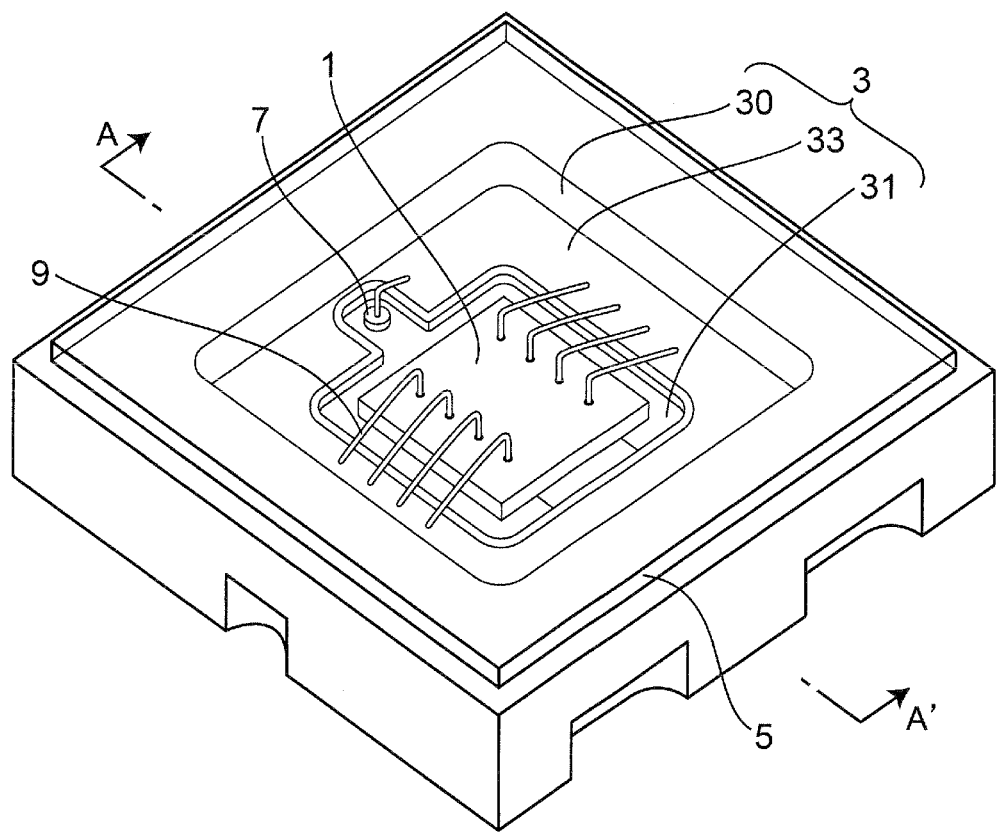
FIG. 1 is a schematic perspective view of a light emitting device according to a first embodiment of the present invention.

Hereinafter, certain embodiments of the present invention will be described.

First Embodiment

A method of manufacturing a light emitting device according to a first embodiment includes a step of forming a protective layer with low water permissibility in a light emitting device including a light emitting element with an electrode structure in which a p-electrode 14 is arranged on a lower surface of a p-type semiconductor layer 11 in a region other than a region facing a n-electrode 17. More specifically, the method of manufacturing a light emitting device includes a step of providing a light emitting element 1 including a semiconductor structure 10a containing a nitride semiconductor and having the above-described electrode structure and a step of forming a protective film 18 on a surface of the light emitting element 1. The step of forming the protective film 18 includes: an A step CS1 of combining oxygen with a surface of the light emitting element 1 using an oxygen raw material gas containing oxygen; a B step CS2 of, with use of a first metal raw material gas containing the first metal, combining a first metal with the oxygen combined with the surface of the light emitting element; a C step CS3 of, with use of an oxygen raw material gas containing oxygen, combining oxygen with the first metal combined with the oxygen; a D step CS4 of, with use of a second metal raw material gas containing the second metal that is different from the first metal, combining a second metal with the oxygen combined with the first metal; and an E step CS5 of combining oxygen with the second metal.

With this method, a light emitting device can be manufactured in which degradation of a semiconductor structure 10a can be reduced. This will be described in detail below.

Figure 9:
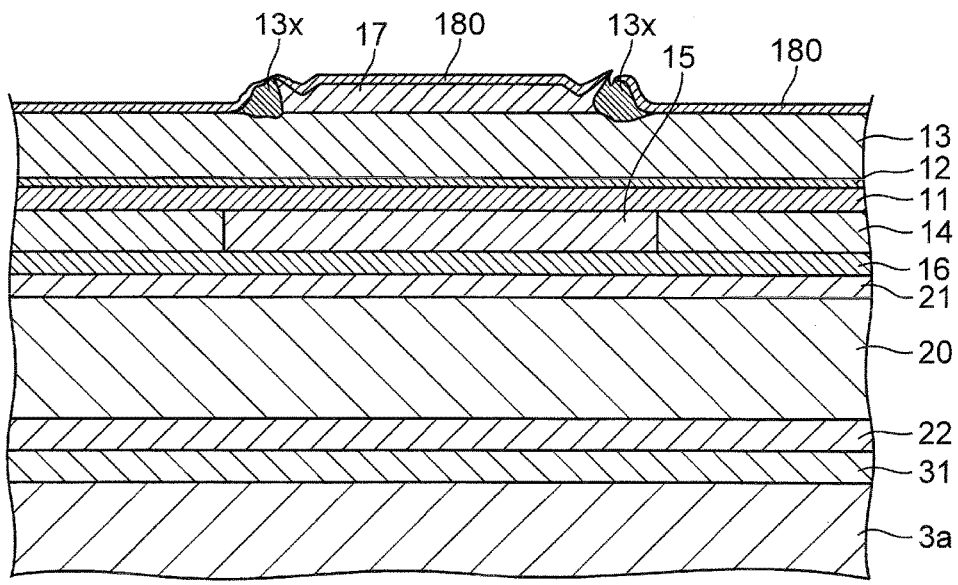
FIG. 9 is a schematic cross-sectional view showing degradation of a nitride semiconductor occurred in a light emitting device according to a comparative example.

In recent years, in accordance with improvement in performance of nitride semiconductor light emitting elements, increase in output has occurred. In other words, high-intensity light emission can be obtained from a light emitting element. However, if water enters a semiconductor structure containing a nitride semiconductor, the semiconductor structure is degraded by moisture and light. The degradation is illustrated in FIG. 9. This phenomenon occurs greatly in a semiconductor structure 13x at a portion near an electrode. This may be because a portion near an electrode is irradiated with light of high light density from an active layer 12 due to high current density, so that the semiconductor structure at the portion near the electrode is decomposed by the irradiated light from an active layer and moisture, and is oxidized and corroded. In a light emitting element with an emission peak wavelength of 410 nm or less having the electrode structure shown in FIGS. 3 to 5, in which the p-electrode 14 is arranged on a lower surface of the p-type semiconductor layer 11 in a region other than a region facing the n-electrode 17, a portion near an end portion of the n-electrode 17 is irradiated with light of high current density and high light intensity from the active layer 12, which allows corrosion to progress. Based on the assumption that a protective film formed by an atomic layer deposition method has high film quality and low moisture permeability, the inventors of the present application tried to solve the above-mentioned problem by covering a light emitting element and its surrounding with a protective film 180 composed of one kind of metal oxide film, but only a limited effect was obtained. Further, the inventors of the present application also tried to suppress permeation of moisture by increasing the thickness of a protective film 180, but similarly, only a limited effect was obtained. In a light emitting device including a light emitting element 1 having an electrode structure in which the p-electrode 14 and the n-electrode 17 are disposed so as not to face each other, it was not sufficient to merely provide a protective film 180 made of one kind of a metal oxide formed by using an atomic layer deposition method.

Then, the inventors of the present application formed a protective film 18 by depositing at least two kinds of metal oxide films using an atomic layer deposition method. With this method, it is believed that defects generated in a first metal oxide film can be covered by a defect-free portion of a second metal oxide film, and thus a protective film 18 having low moisture permeability and high film quality can be obtained. Further, with this method, while obtaining a predetermined effect, the overall thickness of the protective film can also be reduced as compared with depositing one kind of metal oxide film, which allows for reducing absorption of light from the light emitting element 1 in the protective film 18, so that deterioration of light extraction efficiency of a light emitting device can be suppressed.

In the description below, a light emitting device and the method of manufacturing a light emitting device according to the present embodiment will be illustrated in detail.

Figure 2:
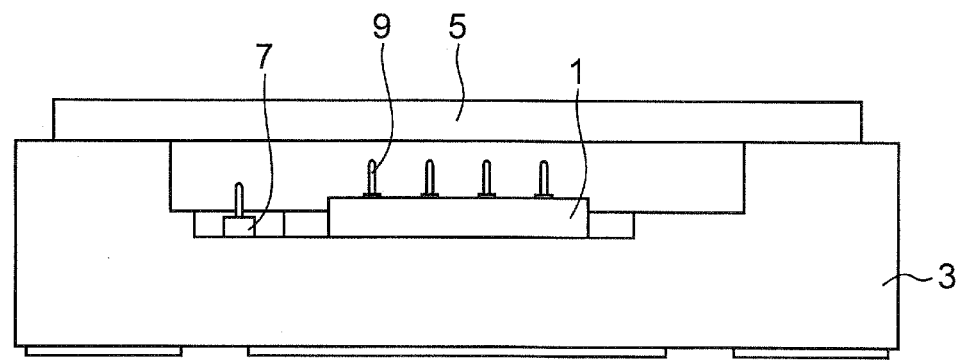
FIG. 2 is a schematic cross-sectional view taken along line A-A' in FIG. 1.
Figure 4:
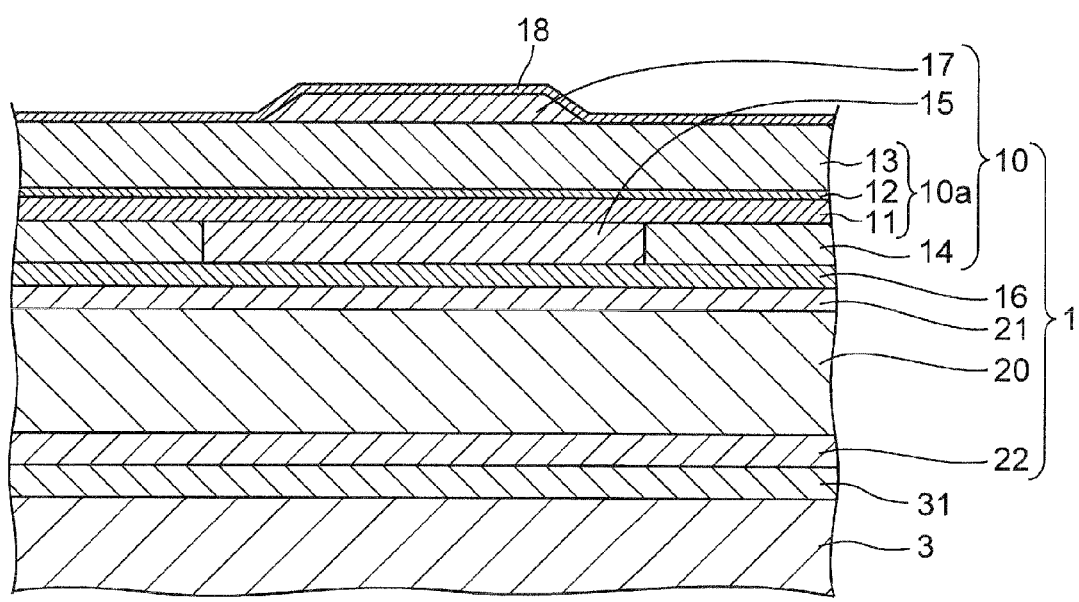
FIG. 4 is a schematic cross-sectional view taken along line B-B' in FIG. 3.
Figure 5:
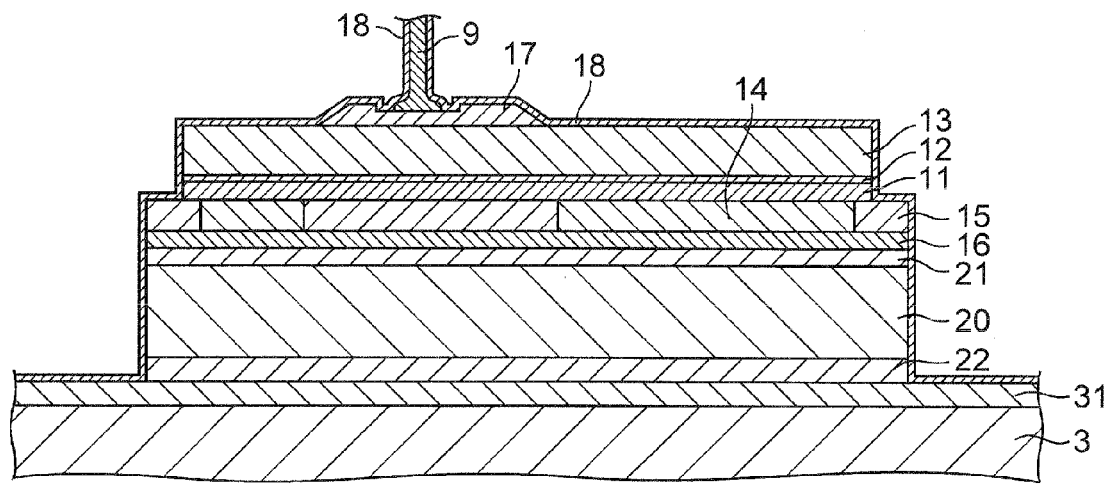
FIG. 5 is a schematic cross-sectional view taken along line C-C' in FIG. 3.

As shown in FIGS. 1 and 2, the light emitting device according to the first embodiment includes a light emitting element 1, a base 3 on which the light emitting element 1 is disposed, and a cover 5. Between the light emitting element 1 and the cover 5 in the light emitting device according to the first embodiment, a light-transmissive resin or the like is not arranged, and a gas is present. In this manner, the light emitting element 1 is protected by the cover 5 without arranging a light-transmissive resin that may be discolored or degraded by irradiation of light with high energy having a peak emission wavelength of 410 nm or less on a surface of the light emitting element 1. This arrangement can reduce change in emission wavelength and unevenness in light emission of the light emitting device due to long-time use. Further, as shown in FIG. 4 and FIG. 5, the light emitting element 1 includes an n-electrode 17 arranged on a portion of an upper surface of the n-type semiconductor layer 13, and a p-electrode 14 arranged on a lower surface of the p-type semiconductor layer at an entire region other than a region facing the n-electrode 17. With this arrangement, even in the case where the peak emission wavelength is selected to be 410 nm or less of the light emitting element, light emission efficiency and light extraction efficiency of the light emitting device can be increased. This is described below in detail. In the case where a p-electrode and an n-electrode is arranged so as to face each other, light emission intensity between the p-electrode and the n-electrode is increased. Meanwhile, visible light and ultraviolet light with peak emission wavelength of 410 nm or less can be greatly absorbed by a metal forming an electrode. Accordingly, a large portion of light emitted between the p-electrode and the n-electrode may be absorbed by a metal composing the n-electrode, so that light extraction efficiency may be decreased, which may lead to decrease in light emission efficiency of the light emitting element 1. For this reason, in the light emitting element 1, the p-electrode 14 and the n-electrode 17 are disposed so as not to face each other. The p-electrode 14 is electrically connected with a p-side connection electrode 22.

In the light emitting device according to the first embodiment, the protective film 18 is disposed so as to cover at least the light emitting element 1. In the protective film 18, a first metal oxide film and a second metal oxide film each formed by the atomic layer deposition method are deposited as described in detail below. In the light emitting device according to the present embodiment, the protective film 18 includes two or more kinds of metal oxide films, each of which is formed by the atomic layer deposition method, so that degradation of the semiconductor structure 10a can be reduced. While illustration of a wire 9 is omitted in FIG. 3 for ease of explanation of the shape of the n-electrode 17, the wire 9 is connected to each n-side connection electrode portion 17a as shown in each of FIGS. 1, 2 and 5.

In the description below, an overall configuration of the light emitting device according to the first embodiment including the base 3 and the light emitting element 1 will be illustrated. Then, the protective film 18 will be illustrated in detail.

Base 3

The base 3 includes, for example, a recess 30. The recess 30 includes a first bottom surface at a central portion thereof and a second bottom surface surrounding the first bottom surface when viewed from above. In the present embodiment, the second bottom surface is located higher than the first bottom surface. A p-side electrode layer 31 is disposed on the first bottom surface of the recess 30, and an n-side electrode layer 33 is disposed on the second bottom surface of the recess 30. The first bottom surface needs only have a height different from a height of the second bottom surface, and for example, the second bottom surface may be located lower than the first bottom surface.

Light Emitting Element 1

The light emitting element 1 is, for example, a light emitting diode configured to emit visible light with a short wavelength or ultraviolet light, and the light emitting element 1 includes a light emitting element structure portion 10 and a support substrate 20. More specifically, the light emitting element 1 includes the semiconductor structure 10a including the n-type semiconductor layer 13, the active layer 12, and the p-type semiconductor layer 11, in this order. The p-electrode 14 is formed on a portion of a surface of the p-type semiconductor layer 11 on a side opposite to a surface provided with the active layer 12. The p-electrode 14 is disposed between the support substrate 20 and the semiconductor structure 10a. The n-electrode 17 is formed on a surface of the n-type semiconductor layer 13 on a side opposite to a surface provided with the active layer 12 in a region other than a region facing the p-electrode 14 (which may be referred to as an "electrode formation region"). In the present specification, the expression "region facing" refers to a region overlapping a member in a plan view from above the n-electrode 17. Also, the expression "n-electrode 17 arranged in the electrode formation region" refers to not only the case where the n-electrode 17 is arranged on the entirety of the electrode formation region, but refers to both of the case where the n-electrode 17 is arranged on the entirety of the electrode formation region and the case where the n-electrode 17 is arranged an inner side of the electrode formation region apart from an outer periphery of the electrode formation region. For example, the n-electrode 17 may be formed on an inner side of the outer periphery of the electrode formation region so that an outer periphery of the n-electrode 17 is located apart from the outer periphery of the electrode formation region by a predetermined distance. By optimizing the distance between the outer periphery of the n-electrode 17 and the outer periphery of the electrode formation region in view of alleviating concentration of current in the n-type semiconductor layer at a portion near the end portion of the n-electrode 17 and light emission efficiency, progress of corrosion at a portion near the end portion of the n-electrode 17 can be prevented, and a light emitting element with high light emission efficiency can be obtained.

In the present specification, ultraviolet light refers to light with a wavelength of 400 nm or less. The peak wavelength of light emitted from the light emitting element 1 is selected to be, for example, 410 nm or less. Examples of the light emitting element 1 includes a light emitting element configured to emit visible light with a wavelength more than 400 nm and equal or less than 410 nm. Further, the lower limit of the peak emission wavelength of the light emitting element 1 is preferably 200 nm, more preferably 250 nm, and the upper limit of the peak emission wavelength of the light emitting element 1 is preferably 410 nm, more preferably 395. Visible light with a short wavelength and ultraviolet light each has high light energy, which tends to easily cause degradation of the semiconductor structure 10a. Accordingly, the effect of reducing degradation of the semiconductor structure 10a becomes more evident in a light emitting device configured to emit visible light with a short wavelength or ultraviolet light and manufactured by using the method of manufacturing the light emitting device according to the present embodiment.

As described above, the light emitting element structure portion 10 includes semiconductor structure 10a including a p-type semiconductor layer 11, an active layer 12 and an n-type semiconductor layer 13 in this order from a support substrate side. The n-electrode 17 having a shape as shown in FIG. 3 is disposed on an upper surface of the n-type semiconductor layer 13, and a p-electrode 14 is disposed on the lower surface of the p-type semiconductor layer 11 so as not to face the n-electrode 17.

The p-type semiconductor layer 11, the active layer 12 and the n-type semiconductor layer 13 can be formed using a nitride semiconductor. For obtaining a light emitting element configured to emit ultraviolet light, the p-type semiconductor layer 11, the active layer 12 and the n-type semiconductor layer 13 are each formed using, for example, a nitride semiconductor containing Al, such as $In_XAl_YGa_{1-X-Y}N$, $0 \leq X$, $0 \leq Y$, $X+Y \leq 1$.

In view of the resistivity of the p-type semiconductor layer 11 higher than the resistivity of the n-type semiconductor layer 13, the shape and the area ratio of the n-electrode 17 and the p-electrode 14 are selected so that current can be evenly supplied to the whole active layer 12.

Figure 3:
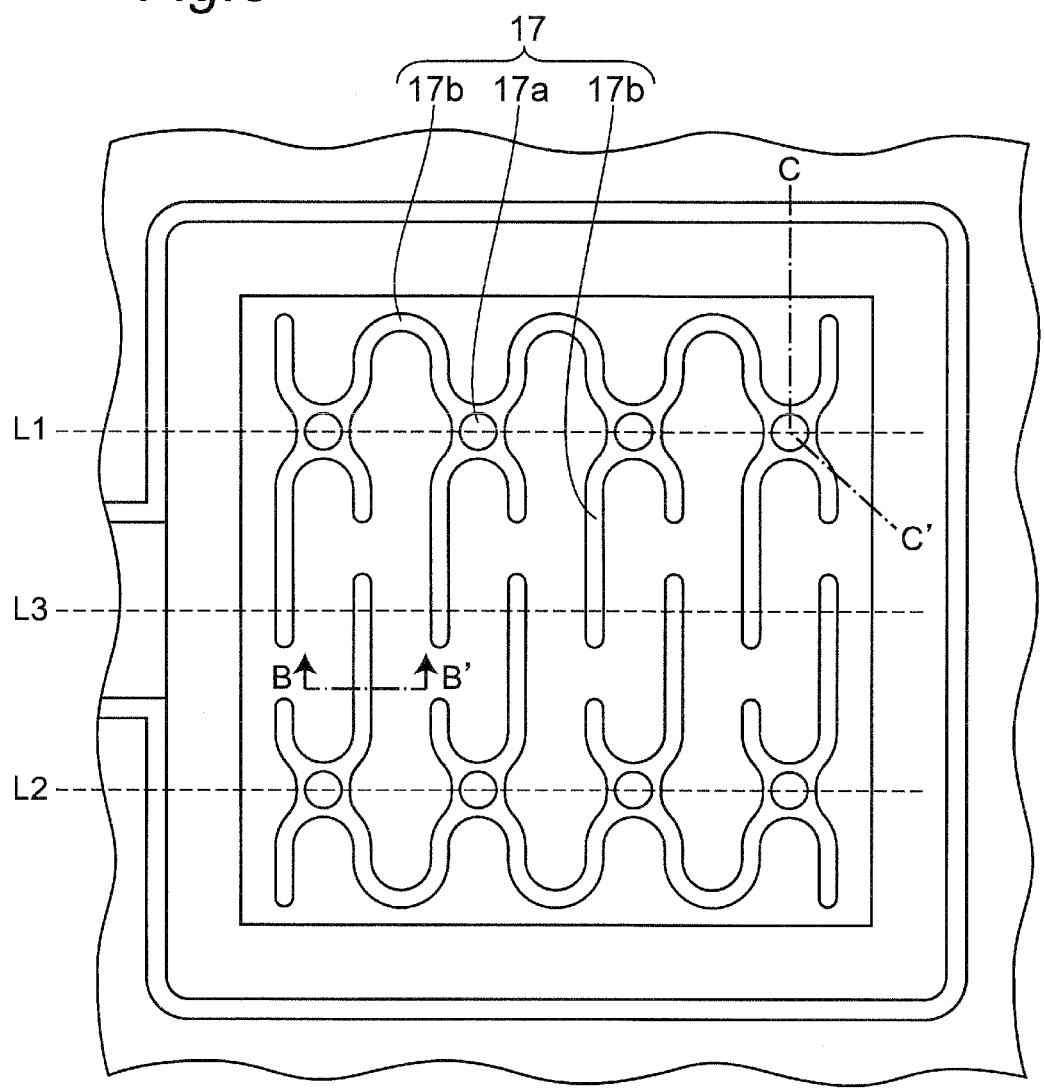
FIG. 3 is a schematic plan view showing a light emitting element and its surrounding portion in FIG. 1.

As shown in FIG. 3, the n-electrode 17 includes a plurality of n-side connection electrode portions 17a (e.g., four n-side connection electrode portions 17a in FIG. 3) disposed at substantially equal intervals on a straight line L1 parallel to one side of the n-type semiconductor layer 13, a plurality of n-side connection electrode portions 17a (e.g., four n-side connection electrode portions 17a in FIG. 3) disposed at substantially equal intervals on a straight line L2 linearly symmetrical with respect to a center line L3, which is parallel to the straight line L1, and extended portions 17b extending from each of the n-side connection electrode portions 17a. In the present embodiment, four extended portions 17b extend from each of the n-side connection electrode portions 17a. Of the four extended portions 17b, two extended portions 17b extend to a region between the straight line L1 and the straight line L2, and the other two extended portions 17b extend in an opposite direction, that is, outside the straight line L1 and the straight line L2. The plurality of extended portions 17b extending to the region between the straight line L1 and the straight line L2 are arranged substantially in parallel and at equal intervals. The plurality of extended portions 17b extending outside the straight line L1 and the straight line L2 are each connected to extended portions 17b extending from adjacent n-side connection electrode portions 17a, which forms a shape including a plurality of circular arc portions as a whole.

With the n-electrode 17 having the configurations described above, electrons can be supplied from the plurality of n-side connection electrode portions 17a are spread over the entirety of the n-type semiconductor layer 13, and can be injected into the entirety of the active layer 12.

Further, in the present embodiment, in view of the resistivity of the p-type semiconductor layer 11 being higher than the resistivity of the n-type semiconductor layer 13, the p-electrode 14 has a larger area than the area of the entire n-electrode 17, and the p-electrode 14 is preferably disposed on the lower surface of the p-type semiconductor layer 11 in the entirety of a region other than a region facing the n-electrode 17. With this arrangement, current can be evenly supplied to the entire active layer 12. A p-side protective film 15 is formed on the lower surface of the p-type semiconductor layer 11 in the region facing the n-electrode 17 (i.e., region in which the p-electrode 14 is not formed).

The support substrate 20 serves to support the light emitting element structure portion 10. For the support substrate 20, a ceramic substrate made of a material such as Si, SiC, AlN or AlSiC, a metal substrate made of a material such as Cu—W or Cu—Mo, a layered substrate made of metal and ceramic such as Cu-diamond, or the like can be used. Si or Cu—W, which is inexpensive and is easily formed into chips, is preferably used.

The support substrate 20 is bonded to a metallization layer 16 disposed on the lower surface of the light emitting element structure portion 10 via a metallization layer 21 disposed on the upper surface of the support substrate 20.

Further, a metallization layer 22 (hereinafter, also referred to as a "p-side connection electrode 22") is disposed on the lower surface of the support substrate 20. The metallization layer 22 is connected to the p-electrode 14 via the support substrate 20, the metallization layer 21 and the metallization layer 16.

Cover 5

In the light emitting device, the cover 5 covers an opening of the recess 30 to protect the light emitting element 1. The cover 5 is made of an inorganic material such as a borosilicate glass, a quartz glass, or a sapphire glass, preferably made of a borosilicate glass with high light-resistance.

Overall Configuration of Light Emitting Device

The light emitting element 1 having configurations as described above is mounted on the first bottom surface so that the p-side connection electrode 22 is connected to the p-side electrode layer 31 disposed on the first bottom surface of the base 3. Using the wire 9, the n-side connection electrode portions 17a at the upper side of the light emitting element 1 are connected to the n-side electrode layer 33 disposed on the second bottom surface of the base 3. The protective film 18 is formed so as to cover at least the light emitting element 1. The light emitting device may include a protective element 7 such as a Zener diode as shown in FIGS. 1 and 2.

Protective Film 18

In the description below, the protective film 18 in the light emitting device according to the first embodiment will be illustrated in detail.

Figure 6:
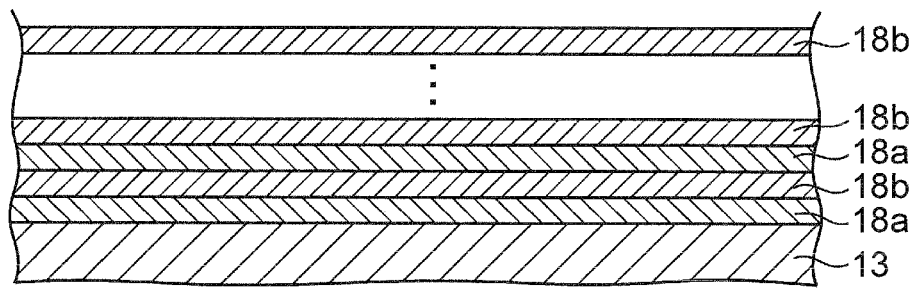
FIG. 6 is a cross-sectional view schematically showing a configuration of a protective film in the first embodiment.

In the light emitting device according to the first embodiment, the protective film 18 is obtained by depositing two different kinds of metal oxide films using the atomic layer deposition method as shown in FIG. 6. In particular, in the protective film 18 according to the first embodiment, first metal oxide films 18a with a minimum unit thickness in the thickness direction and second metal oxide films 18b with a minimum unit thickness in the thickness direction are alternately deposited. In this specification, the expression "metal oxide film with a minimum unit thickness in the thickness direction" refers to a metal oxide film obtained by one step using an oxygen raw material gas and one step using a metal raw material gas. Examples of the metal oxide film include a film with a substantially uniform thickness, a film including interspersed openings, and a film made of a plurality of separated films. In the description below, the metal oxide film with a minimum unit thickness in the thickness direction may also be referred to as a "single metal oxide film." In particular, the single metal oxide film in which a first metal is used is referred to as a "single first metal oxide film", and the single metal oxide film in which a second metal is used is referred to as a "single second metal oxide film."

In the protective film 18 according to the first embodiment, the first metal can be selected from the group consisting of, for example, Al, Nb, Ti and Si, and the second metal may be another metal selected from the group consisting of Al, Nb, Ti and Si, which is different from the first metal. Preferably, one of the first metal and the second metal is Al, and the other of the first metal and the second metal is Si. With this arrangement, the protective film 18 having high film quality and good light transmissivity can be obtained.

The protective film 18 in the first embodiment is preferably arranged continuously from a surface of the n-electrode 17 to a surface of the semiconductor structure 10a. That is, it is preferable that the protective layer 18 continuously covers the surface of the n-electrode 17 and a surface of the n-type semiconductor layer 13. At a portion near an electrode, light of high light density is irradiated from an active layer 12, and thus degradation is easily generated, so that effect of suppressing degradation of the semiconductor structure 10a can be obtained.

In the description below, the method of manufacturing the light emitting device according to the first embodiment is illustrated.

The method of manufacturing the light emitting device according to the first embodiment includes providing the light emitting element 1, mounting, and forming the protective film 18.

Providing Light Emitting Element 1

The step of providing the light emitting element 1 includes forming a semiconductor structure, forming a p-electrode, forming a p-side protective film, forming a bonding layer, bonding, removing growth substrate, and forming an n-electrode. Each step is described below.

Forming Semiconductor Structure

In the step of forming of the semiconductor structure, for example, on a surface of a growth substrate made of sapphire, a gas containing a predetermined semiconductor material and dopants and the like is supplied, and the n-type semiconductor layer 13, the active layer 12, and the p-type semiconductor layer 11 are grown in this order, so that the semiconductor structure 10a is formed.

Forming P-Electrode

In the step of forming the p-electrode, the p-electrode 14 with a predetermined shape is formed on a surface of the p-type semiconductor layer on a side opposite to a surface provided with the active layer 12. For example, for the p-electrode, films of Ag, Ni, Ti, and Pt formed in this order on a portion of the surface of the p-type semiconductor layer 11 can be used. In the description below, a region of a surface of the p-type semiconductor layer 11 on which the p-electrode 14 is formed is referred to as a first region. Also, a region of a surface of the p-type semiconductor layer 11 other than the first region is referred to as a second region. A region of a surface of the n-type semiconductor layer 13 other than a region facing the first region is referred to as the electrode formation region. That is, a region of a surface of the n-type semiconductor layer 13 facing the second region is referred to as the electrode formation region.

Forming P-Side Protective Film

In the step of forming the p-side protective film, the p-side protective film 15 is formed on the second region of the surface of the p-type semiconductor layer 11. The p-side protective film 15 is formed of, for example, $SiO_2$ film. The step of forming the p-side protective film may be performed before the step of forming the p-electrode.

Forming Bonding Layer

In the step of forming the bonding layer, a metallization layer 16 is formed on a surface of each of the p-electrode 14 and the p-side protective layer 15, and a metallization layer 21 is formed on a surface of the support substrate 20. The metallization layer 16 is formed by, for example, layering films of Ti, Pt, Au in this order from a side provided with the p-electrode 14 and the p-side protective layer 15. The metallization layer 21 is formed by, for example, layering films of Ti, Pt, Au in this order from a side provided with the support substrate 20.

Bonding

In the step of bonding, the metallized layer 16 and the metallized layer 21 are bonded, so that the semiconductor structure 10a supported by the growth substrate is bonded with the support substrate 20.

Removing Growth Substrate

In the step of removing the growth substrate, UV laser light of pulse oscillation with high light density is irradiated from a side provided with the growth substrate to remove the semiconductor structure 10a from the growth substrate.

Forming N-Electrode

In the step of forming the n-electrode, the n-electrode 17 is formed on the electrode formation region of the surface of the n-type semiconductor layer 13. The n-electrode 17 is formed by, for example, layering films of Ti, Pt, Au, Pt, and Ti in this order from a side provided with the n-type semiconductor layer 13.

In the method of manufacturing according to the present embodiment, the n-type semiconductor layer 13 can be thinned before the step of forming the n-electrode 17.

With this arrangement, absorption of light emitted from the active layer 12 by the n-type semiconductor layer 13 can be reduced, so that light extraction efficiency can be increased.

Mounting

The light emitting element 1 is mounted on the first bottom surface of the base 3 so that the p-side electrode layer31 and the p-side connection electrode 22 are connected.

Subsequently, the n-side connecting electrode portion 17a on an upper surface of the semiconductor structure 10a and the n-side electrode layer 33 formed on the second bottom surface are connected via the wire 9 (i.e., wire-bonded).

Forming Protective Film

Figure 7:
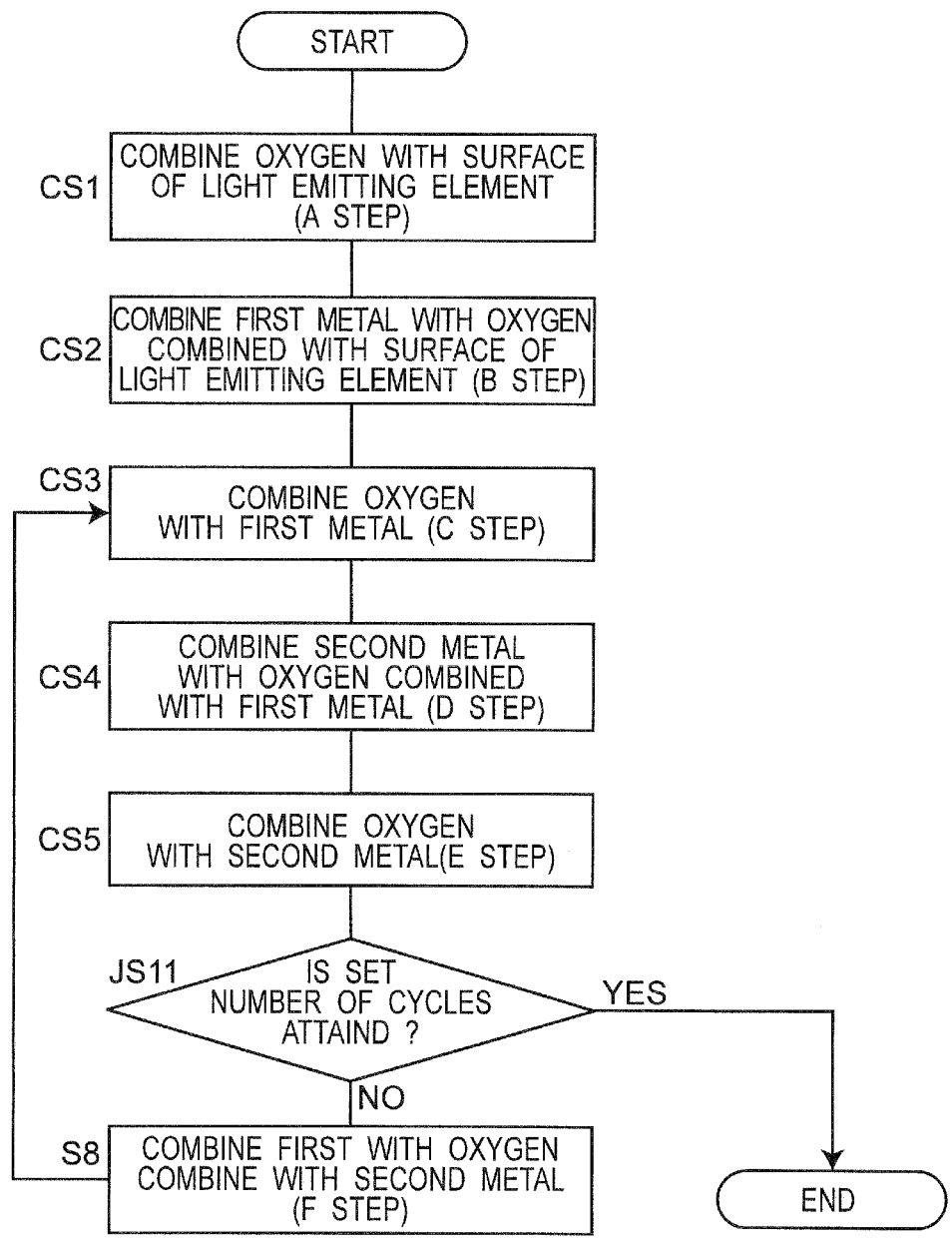
FIG. 7 is a process flow diagram showing a process of forming a protective film in a method of manufacturing a light emitting device according to the first embodiment.

In the first embodiment, the protective film 18 is formed in accordance with the process flow diagram in FIG. 7.

First, the base 3 on which the light emitting element 1 mounted is then set in a vacuum chamber of an atomic layer deposition apparatus.

Step CS1

Evacuation is performed so that the inside of the vacuum chamber reaches a predetermined vacuum degree, and the light emitting element 1 and the base 3 are heated to a predetermined film-formation temperature. The film formation temperature is preferably selected in a range of 150° C. to300° C., more preferably in a range of 200° C. to 250° C. With the film formation temperature of 150° C. or greater, the barrier property of the protective film 18 can be improved, and organic substances etc., deposited on the light emitting element 1 can be removed. With the film formation temperature of 300° C. or smaller, degradation of the light emitting element 1 by heat can be reduced.

Then, An oxygen raw material gas containing oxygen is introduced into the vacuum chamber to combine oxygen with the surface of the light emitting element 1, a surface of the wire 9, and the entirety of the recess of the base 3 (A step). After the oxygen is combined with the surface of the light emitting element 1 and other portions described above, the oxygen raw material gas is purged.

At this time, an $O_3$ (ozone) gas can be used for the oxygen raw material gas containing oxygen. Using a gas as the raw material allows oxygen to be more easily combined with the surface of the light emitting element 1, the surface of the wire 9, and the entirety of the recess of the base 3 compared with the case where plasma is used.

In this step, OH group may be combined with the surface of the light emitting element 1 and other portions described above using $H_2O$.

Step CS2

Subsequently, a first metal raw material gas containing a first metal is introduced into the vacuum chamber to combine the oxygen combined with the surface of the light emitting element 1 and other portions described above with the first metal raw material gas, so that the first metal is combined with the oxygen combined with the surface of the light emitting element 1 and other portions described above (B step).

After combining the first metal with the oxygen combined with the surface of the light emitting element 1 and other portions described above, the first metal raw material gas is purged.

Step CS3

An oxygen raw material gas containing oxygen is introduced into the vacuum chamber to react the first metal combined with the oxygen with the oxygen raw material gas, so that oxygen is combined with the first metal combined with the oxygen (C step).

In the case where a raw material gas of Si is used for the first metal raw material gas in this step, an $O_3$ (ozone) gas is preferably used for the oxygen raw material gas containing oxygen. This is because Si does not easily react with $H_2O$, and by using an $O_3$ (ozone) gas, reactivity with Si can be improved. In accordance with the material of the first metal, $H_2O$ may be used to combine OH group with the first metal.

After the oxygen is combined with the first metal, the oxygen raw material gas is purged.

A first metal oxide film (i.e., single first metal oxide film) deposited with a minimum unit thickness in the thickness direction is formed through the steps CS1 to CS3.

Step CS4

After the single first metal oxide film is formed, using a second metal raw material gas containing a second metal different from the first metal, the second metal raw material gas is reacted with the oxygen combined with the first metal, so that the second metal is combined with the oxygen combined with the first metal (D step).

After the second metal is combined with the oxygen, the second metal raw material gas is purged.

Step CS5

Subsequently, oxygen is combined with the second metal combined with the oxygen (E step).

In this step, an oxygen raw material gas containing oxygen is introduced into the vacuum chamber so that oxygen is combined with the second metal combined with the oxygen. In the case of using a raw material gas of Si for the second metal raw material gas, an $O_3$ (ozone) gas is preferably used for the oxygen raw material gas containing oxygen. In accordance with the material of the second metal, $H_2O$ may be used to combine OH group with the second metal.

In this step, with an atmospheric pressure of the inside of the vacuum chamber, oxygen may be combined with the second metal combined with the oxygen by reacting the oxygen contained in the air combined with the second metal.

Through the steps CS4 and CS5 as described above, a second metal oxide film (i.e., single second metal oxide film) deposited with a minimum unit thickness in the thickness direction is formed.

Through the steps CS1 to CS5 as described above, a multilayered structure of single metal oxide films in which one single second metal oxide film is deposited on one single first metal oxide film.

In the case where a film in which one single second metal oxide film is deposited on one single first metal oxide film is used for the protective film 18, the process is completed in a step JS11 (the set number of cycles is 1).

In the first embodiment, the single first metal oxide film and the single second metal oxide film may be alternately deposited a predetermined number of cycles to form the protective film 18. In this case, after carrying out step JS11, in a step S8, with use of a first metal raw material gas containing a first metal, the oxygen combined with the second metal in the step CS5 is combined with the first metal (F step). A cycle including the step S8, the step CS3, the step CS4 and the step CS5 is repeated n times (where n is an integer of 1 or more) (G step). When it is determined in the step JS11 that the set number of cycles is attained, the process is completed. In this way, the protective film 18 in which the single first metal oxide film and the single second metal oxide films are alternately deposited a predetermined times is formed.

In the above-described steps, for example, Al, Nb, Ti, Si or the like can be used for the first metal, and for the second metal, a metal different from the first metal among the above-described metals can be used. Examples of the first metal raw material gas and second metal raw material gas include trimethylaluminum (TMA) for an Al raw material gas, tris(diethylamide)(tert-butylimide)niobium (V) for a Nb raw material gas, tetrakis(dimethylamide)titanium for a Ti raw material gas, and a tris(dimethylamino)silane gas or a bis(diethylamino)silane gas for a Si raw material gas.

According to Comparative Example 1 and Comparative Example 2 described below, it is observed that degradation of the semiconductor structure 10a can be more greatly reduced with a film formed using a bis(diethylamino)silane gas than with a film formed using a tris(dimethylamino)silane gas. This may be because a bis(diethylamino)silane gas is bivalent while a tris(dimethylamino)silane gas is trivalent, which allows the distance between adjacent molecules in the Si raw material to be reduced when a Si raw material gas is combined with oxygen, and therefore a dense film can be formed. Thus, the first metal raw material gas and the second metal raw material gas may be each preferably a gas having a relatively small valence, such as a bis(diethylamino)silane gas.

In view of a transmittance of light from the light emitting element and quality of a film to be obtained, it is preferable that for the first metal raw material gas and second metal raw material gas, trimethylaluminum is used as the first metal raw material gas, and a bis(diethylamino)silane gas is used as the second metal raw material gas.

In the above description with reference to the process flow diagram in FIG. 7, first, the first metal oxide film is formed on the surface of the light emitting element 1 and other portions described above, and lastly the second metal oxide film is formed to complete the process, so that the protective film 18 has a structure in which the same number of single first metal oxide films and single second metal oxide films are deposited. However, the present embodiment is not limited to the order described above, and the first metal oxide film may be first formed on the surface of the light emitting element 1 and other portions described above, and lastly the first metal oxide film may be formed to complete the process.

Fixing Cover

The cover 5 is fixed so as to close an opening of the recess of the base 3. The cover 5 is fixed on an upper surface of the base 3 using, for example, an adhesive agent such as a silicone resin. While the adhesive agent may be disposed on the upper surface of the base 3 so as to surround the recess, the adhesive agent may by disposed on four corners of the base 3 in the present embodiment.

In the light emitting device according to the first embodiment, which has configurations as described above, the protective film 18 in which a single second metal oxide film is deposited on a single first metal oxide film is disposed on at least a surface of the light emitting element 1, which allows degradation of the semiconductor structure 10a to be effectively suppressed. This may be because defects generated in the single first metal oxide film can be covered with a defect-free portion of the single second metal oxide film, and therefore the protective film 18 having a small moisture permeability and high film quality can be obtained. Also, with two kinds of metal oxide films, the overall thickness of the protective film can be reduced, so that absorption of light from the light emitting element 1 by the protective film 18 can be reduced. By deposition of one kind of metal oxide film with a large thickness, while degradation of the semiconductor structure can be reduced to a certain degree, overall thickness of the protective film is increased, so that absorption of light from the light emitting element may be increased. On the other hand, according to the present embodiment, degradation of the semiconductor structure 10a can be reduced even in the case where the overall thickness of the protective film is reduced, and therefore absorption of light by the protective film 18 can be suppressed, so that deterioration of light extraction efficiency in the light emitting device can be easily suppressed.

Second Embodiment

A light emitting device according to a second embodiment is described below.

The light emitting device according to the second embodiment has configurations similar to in the first embodiment except that the protective film 18 has a different configuration.

Protective Film 18 of Second Embodiment

In the description below, a protective film 18 of the light emitting device according to the second embodiment will be illustrated in detail.

The protective film 18 of the light emitting device according to the second embodiment is the same as that in the first embodiment in that the protective film 18 is a film obtained by depositing two different kinds of metal oxide films using an atomic layer deposition method, but the protective film 18 in the second embodiment is different from that in the first embodiment described below.

The protective film 18 according to the second embodiment is a multilayer film obtained by depositing a multi-layer first metal oxide film, which has two or more single first metal oxide films each deposited with a minimum unit thickness in the thickness direction, and a multi-layer second metal oxide film, which has two or more single second metal oxide films each deposited with a minimum unit thickness, in the thickness direction. That is, in the present embodiment, a first metal oxide film is deposited multiple times to form a multi-layer first metal oxide film 18a, and a second metal oxide film is deposited multiple times to form a multi-layer second metal oxide film 18b (see FIG. 6). While FIG. 6 is provided to show the protective film 18 in the first embodiment, illustration in FIG. 6 is also applied to the second embodiment in that first metal oxide films and second metal oxide films are alternately deposited. Thus, also in the second embodiment, the protective film 18 can be described with reference to FIG. 6.

In the protective film 18 according to the second embodiment, similarly to that in the first embodiment, the first metal can be selected from, for example, Al, Nb, Ti and Si, and for the second metal, a metal different from the first metal can be selected from the above-described metals. It is preferable that one of the first metal and the second metal is Al, and the other of the first metal and the second metal is Si.

In the description below, a method of forming the protective film 18 according to the second embodiment is illustrated.

Method of Preparing Protective Film 18 according to the Second Embodiment

Figure 8:
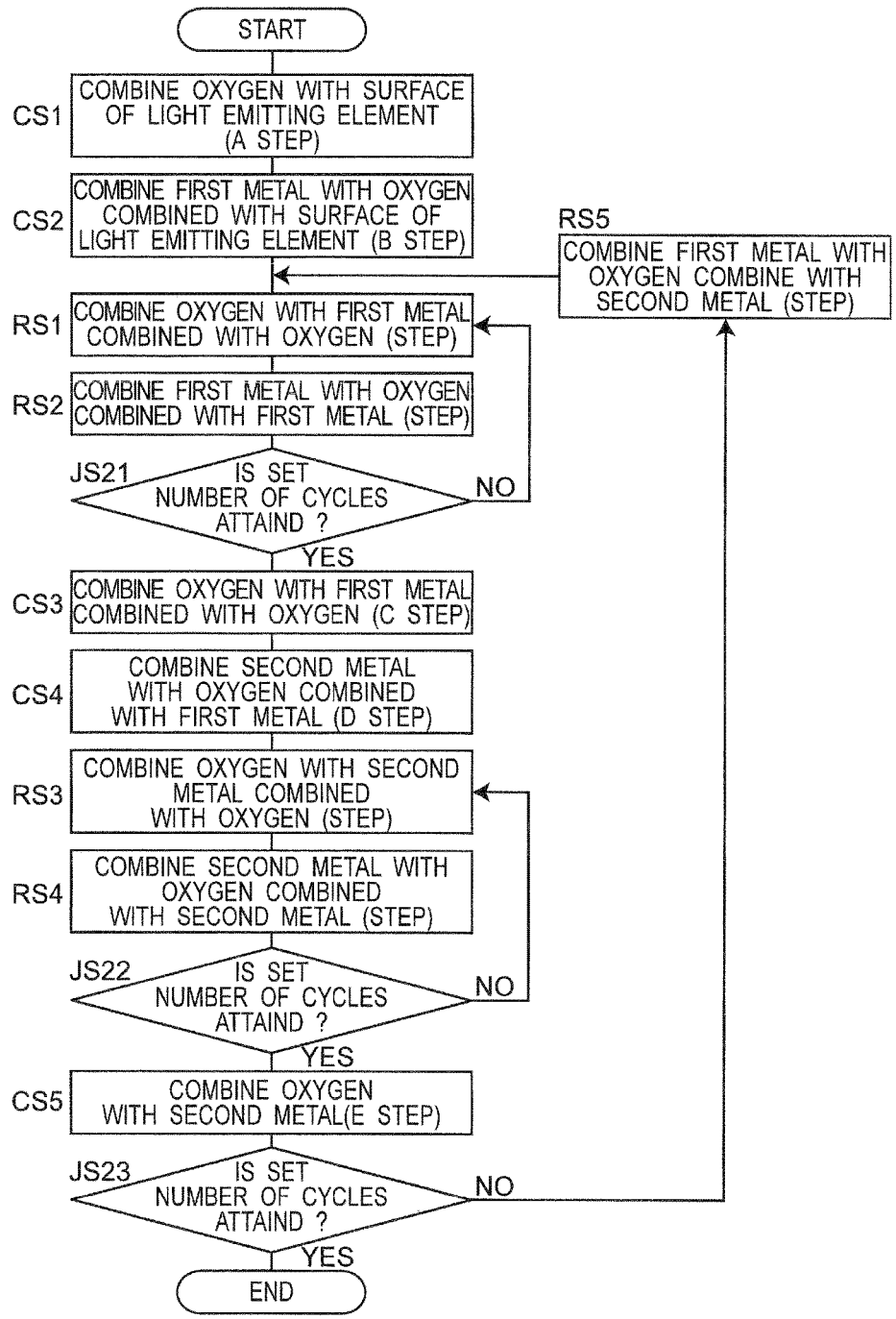
FIG. 8 is a process flow diagram showing a process of forming a protective film in a method of manufacturing a light emitting device according to a second embodiment of the present invention.

In the second embodiment, the protective film 18 is formed in accordance with the process flow diagram in FIG. 8.

Pre-Step

In the same manner as in the first embodiment, a light emitting element 1 is mounted and wire-bonded.

A base 3 on which the light emitting element 1 is mounted is set in a vacuum chamber of an atomic layer deposition apparatus.

First, step CS1 and step CS2 that are same as in the first embodiment 1 are carried out, and thereafter, a cycle including carrying out a step RS1 and a step RS2 as described below is repeated m times (where m is an integer of 1 or more).

Step RS1

In the step RS1, an oxygen raw material gas containing oxygen is introduced into a vacuum chamber to react the oxygen raw material gas with first metal combined with oxygen, so that the oxygen is combined with the first metal combined with the oxygen. In this step, an $O_3$ (ozone) gas can be preferably used as the oxygen raw material gas containing oxygen. In accordance with the material of the first metal, $H_2O$ may be used to combine OH group with the first metal.

After the oxygen is combined with the first metal, the oxygen raw material gas is purged.

Step RS2

In the step RS2, a first metal raw material gas containing the first metal is introduced into the vacuum chamber to react the first metal raw material gas with the oxygen combined with the first metal, so that the first metal is combined with the oxygen combined with the first metal.

After the first metal is combined with the oxygen, the first metal raw material gas is purged.

After a cycle including the step RS1 and the step RS2 is repeated m times, a step JS21 is carried out, and then the step CS3 and the step CS4, which are same as in the first embodiment, are carried out. After that, a cycle including a step RS3 and a step RS4 as described below is repeated p times (where p is an integer of 1 or more).

Step RS3

In the step RS3, an oxygen raw material gas containing oxygen is introduced into the vacuum chamber to react the oxygen raw material gas with the second metal combined with the oxygen, so that oxygen to be combined with the second metal combined with the oxygen. In this step, while an $O_3$ (ozone) gas is preferably used for the oxygen raw material gas containing oxygen, in accordance with the material of the second metal, $H_2O$ may be used to combine OH group with the second metal.

After the oxygen is combined with the second metal, the oxygen raw material gas is purged.

Step RS4

In the step RS4, a second metal raw material gas containing a second metal is introduced into the vacuum chamber to react the second metal raw material gas with the oxygen combined with the second metal, so that the second metal is combined with the oxygen combined with the second metal.

After the second metal is combined with the oxygen, the second metal raw material gas is purged.

After a cycle including the step RS3 and the step RS4 is repeated p times, a step JS22 is carried out, and then the step CS5 same as in the first embodiment is carried out. A step JS23 and a step RS5 are carried out, and the step RS1 to the step CS5 are repeated until the set number of cycles is attained.

In the step RS5, a first metal raw material gas containing the first metal is introduced into the vacuum chamber to react the first metal raw material gas with the oxygen combined with the second metal in the step CS5, so that the first metal is combined with the oxygen combined with the second metal.

Through the steps described above, the protective film 18 according to the second embodiment in which the multi-layer first metal oxide film and the multi-layer second metal oxide film are alternately deposited is formed.

In the above-described steps, for example, Al, Nb, Ti, Si or the like can be used for the first metal, and, of these metals, a metal different from the first metal can be used for the second metal. Examples of the first metal raw material gas and the second metal raw material gas include trimethylaluminum (TMA) for an Al raw material gas, tris(diethylamide)(tert-butylimide)niobium (V) for a Nb raw material gas, tetrakis(dimethylamide)titanium for a Ti raw material gas, and a tris(dimethylamino)silane gas or a bis(diethylamino)silane gas for a Si raw material gas.

In the above-described illustration with reference to the process flow diagram in FIG. 8, first, the multi-layer first metal oxide film are formed on the surface of the light emitting element and other portions described above, and finally the multi-layer second metal oxide film are formed to complete the process, so that the protective film 18 has a structure in which the same number of first metal oxide film layers and second metal oxide film layers are deposited. However, the present embodiment is not limited to this order, and the multi-layer first metal oxide film may be formed on a surface of the light emitting element 1 and other portions described above, and lastly the multi-layer first metal oxide film may be formed to complete the process.

In the light emitting device according to the second embodiment, which is configured as described above, the protective film 18 in which the multi-layer first metal oxide film and the multi-layer second metal oxide film are alternately deposited is disposed on at least the surface of the light emitting element 1, so that degradation of the semiconductor structure 10a can be effectively reduced. This may be because defects generated in the multi-layer first metal oxide film can be covered with a defect-free portion of the multi-layer second metal oxide film, and therefore the protective film 18 having a small moisture permeability and high film quality can be obtained. Also, with two kinds of metal oxide films, the overall thickness of the protective film can be reduced, which allows absorption of light from the light emitting element 1 by the protective film 18 to be reduced, so that deterioration of light extraction efficiency in the light emitting device is easily suppressed. Further, with the protective film 18 in which the multi-layer first metal oxide film and the multi-layer second metal oxide film are alternately deposited, the thickness of each film can be easily controlled. Accordingly, the protective film 18 can function as an antireflection film, which can prevent reflection of light from the semiconductor structure 10a, so that extraction of light from the light emitting element 1 can be increased.

Variations of First and Second Embodiments

In the first embodiment, the single first metal oxide film and the single second metal oxide film are alternately deposited a predetermined number of times to form the protective film 18. In the second embodiment, the multi-layer first metal oxide film and the multi-layer second metal oxide film are alternately deposited a predetermined number of times to form the protective film 18.

Meanwhile, any methods in which the protective layer 18 is formed by depositing a first metal oxide film and a second metal oxide film made of a metal different from the first metal is included in the scope of the present invention. For example, the protective film 18 in which a single first metal oxide film and a the multi-layer second metal oxide film are alternately deposited may be formed.

For forming of such protective film 18, in the process flow diagram in FIG. 8 in the second embodiment, the step CS3 may be carried out after the step CS2 without carrying out the step RS1, the step RS2 and the step JS21.

The protective film 18 can also be made of a combination of a single first metal oxide film, a single second metal oxide film, a multi-layer first metal oxide film, and/or a multi-layer second metal oxide film.

Also in these manners, a light emitting device in which degradation of the semiconductor structure 10a can be effectively suppressed can be provided.

In the first embodiment, the second embodiment and variations of these, the light emitting element 1 is mounted on the first bottom surface of the base 3, the n-side connection electrode portion 17a and the n-side electrode layer 33 are wire-bonded, and then the protective film 18 is formed by the atomic layer deposition method.

Accordingly, in the light emitting devices according to the first embodiment, the second embodiment and the variations of these, the protective film 18 in which two kinds of metal oxide films are deposited with a predetermined thickness can be formed even on a corner portion, where has an orientation of a surface is discontinuously varied, such as a connecting end of the light emitting element 1 and the first bottom surface of the base 3, as well as on other flat surface portions.

Further, also on wire-bonding portions, the protective film 18 in which two kinds of metal oxide films are deposited can be formed as can be formed on other flat surface portions.

Thus, according to the manufacturing methods of the first embodiment, the second embodiment and variations of these, a light emitting device with greatly high reliability and in which degradation of the semiconductor structure 10a is effectively suppressed can be manufactured.

EXAMPLES

Example 1

In Example 1, $Al_2O_3$ and $SiO_2$ were alternately deposited to form a protective film 18 in the light emitting device shown in FIGS. 1 to 5. In Example 1, the cover 5 was fixed on an upper surface of the base 3 at four corners of the upper surface of the base 3, and airtight structure was not employed.

In Example 1, for a semiconductor structure 10a of a light emitting element 1, a light emitting diode having a light emission peak wavelength of 365 nm and including an active layer made of a nitride semiconductor represented by AlGaN was employed.

In Example 1, the protective film 18 was formed in the manner described below.

(1) A film formation target with a light emitting element 1 mounted on a base 3 was set in a vacuum chamber of an atomic layer deposition apparatus, and the vacuum chamber was evacuated to 1 Pa.

(2) The temperature of each of the light emitting element 1 and the base 3 was increased to 200° C.

(3) An ozone ($O_3$) gas was introduced so as to combine oxygen with surfaces of each of the light emitting element 1 and the base 3, and then the ozone ($O_3$) gas was purged.

(4) A trimethylaluminum (TMA) gas was introduced to react trimethylaluminum (TMA) with the oxygen on the surfaces of the light emitting element 1 and the base 3 (i.e., first reaction), and then the trimethylaluminum (TMA) gas was purged.

(5) An ozone ($O_3$) gas was introduced to react ozone with the trimethylaluminum (TMA) combined with oxygen in the first reaction (i.e., second reaction), so that oxygen was combined with aluminum in place of methyl group in the trimethylaluminum (TMA), and the ozone ($O_3$) gas was purged.

Through the steps (1) to (5) described above, an $Al_2O_3$ with a thickness of 1.2 Å was formed.

(6) After the ozone gas was purged in the step (5), a tris (dimethylamino)silane gas was introduced to react tris(dimethylamino)silane with the oxygen combined with aluminum (i.e., third reaction), so that tris(dimethylamino)silane was combined with the oxygen combined with aluminum, and the tris(dimethylamino) silane gas was purged.

(7) An ozone gas was introduced to react ozone with the tris(dimethylamino)silane combined with oxygen in the third reaction (i.e., fourth reaction), so that oxygen in place of amino group in the tris(dimethylamino)silane was combined with the tris(dimethylamino)silane combined with oxygen, and then the ozone gas was purged.

Through the steps (6) and (7) described above, $SiO_2$ with a thickness of 1.2 Å was formed on the $Al_2O_3$.

(8) After the ozone ($O_3$) gas was purged in the step (7), a trimethylaluminum (TMA) gas was introduced to react trimethylaluminum (TMA) with the oxygen combined with Si, and then the trimethylaluminum (TMA) gas was purged.

A cycle including the steps (8), (5), (6) and (7) was repeated to form the protective film 18 with a total thickness of 200 Å in which $Al_2O_3$ to be a single metal oxide film and $SiO_2$ to be a single metal oxide film were alternately deposited.

Example 2

In Example 2, $Al_2O_3$ that is the multi-layer first metal oxide film and $SiO_2$ that is the multi-layer second metal oxide film were alternately deposited to form the protective film 18 in the light emitting device of Example 1.

The light emitting device of Example 2 had the same configuration as in Example 1 except for structure of the protective film 18.

In Example 2, the protective film 18 was formed in the manner described below.

(1) A film formation target with a light emitting element 1 mounted on a base 3 was set in a vacuum chamber of an atomic layer deposition apparatus, and the vacuum chamber was evacuated to 1 Pa.

(2) The temperature of each of the light emitting element 1 and the base 3 was increased to 200° C.

(3) An ozone ($O_3$) gas was introduced so as to combine oxygen with surfaces of each of the light emitting element 1 and the base 3, and then the ozone ($O_3$) gas was purged.

(4) A trimethylaluminum (TMA) gas was introduced to react trimethylaluminum (TMA) with the oxygen on the surfaces of the light emitting element 1 and the base 3 (i.e., first reaction), and then the trimethylaluminum (TMA) gas was purged.

(5) An ozone ($O_3$) gas was introduced to react ozone (i.e., second reaction) with the trimethylaluminum (TMA) combined with oxygen, so that oxygen was combined with aluminum in place of methyl group in the trimethylaluminum (TMA), and then the ozone ($O_3$) gas was purged.

(6) A trimethylaluminum (TMA) gas was introduced to react trimethylaluminum (TMA) with the oxygen combined with aluminum in the step (5) (i.e., third reaction), the trimethylaluminum (TMA) gas was purged.

Subsequently, the steps (6) and (7) were repeated.

(7) An ozone ($O_3$) gas was introduced to react ozone with the trimethylaluminum (TMA) combined with oxygen in the third reaction, so that oxygen was combined with aluminum in place of methyl group in the trimethylaluminum (TMA), and then the ozone ($O_3$) gas was purged.

Through steps (1) to (7), $Al_2O_3$ with a thickness of 20 Å was formed.

(8) After $Al_2O_3$ with a thickness of 20 Å was formed, a tris(dimethylamino)silane gas was introduced to react tris(dimethylamino)silane with the oxygen combined with aluminum (i.e., fourth reaction), so that tris(dimethylamino)silane was combined with the oxygen combined with aluminum, and then the tris(dimethylamino)silane gas was purged.

(9) An ozone gas was introduced to react ozone with the tris(dimethylamino)silane combined with oxygen in the fourth reaction (i.e., fifth reaction), so that Si in place of amino group in the tris(dimethylamino)silane was combined with the oxygen, and then the ozone gas was purged.

(10) A tris(dimethylamino)silane gas was introduced to react tris(dimethylamino)silane with the oxygen combined with Si, so that tris(dimethylamino)silane was combined with oxygen combined with Si, and then the tris(dimethylamino)silane gas was purged.

The above steps (9) and (10) were repeated.

(11) An ozone gas was introduced to react ozone with the tris(dimethylamino)silane combined with oxygen, so that ozone was combined with Si in place of amino group in the tris(dimethylamino)silane, and then the ozone gas was purged.

Through the above-described steps (8) to (11), $SiO_2$ with a thickness of 20 Å was formed.

(12) A trimethylaluminum (TMA) gas was introduced to react trimethylaluminum (TMA) with the oxygen combined with Si in the step (11) (i.e., sixth reaction), and then the trimethylaluminum (TMA) gas was purged.

Subsequently, a cycle including the steps (12), (5), (6), (7), (8), (9), (10) and (11) was repeated to form the protective film 18 with a total thickness of 200 Å, in which $Al_2O_3$ with a thickness of 20 Å to be a multi-layer first metal oxide film and $SiO_2$ with a thickness of 20 Å to be a multi-layer second oxide film were alternately deposited Comparative Example 1

In Comparative Example 1, a light emitting device was manufactured in the same manner as in Example 1 except that, on a light emitting element and a base, $SiO_2$ was formed with a thickness of 200 Å by an atomic layer deposition method to obtain a protective film in the light emitting device of Example 1.

More specifically, the process described below was carried out.

(1) A film formation target with a light emitting element mounted on a base was set in a vacuum chamber of an atomic layer deposition apparatus, and the vacuum chamber was evacuated to 1 Pa.

(2) The temperature of each of the light emitting element and the base was increased to 200° C.

(3) An ozone ($O_3$) gas was introduced to combine oxygen with surfaces of the light emitting element and the base, and then the ozone ($O_3$) gas was purged.

(4) After the ozone gas was purged, a tris(dimethylamino)silane gas was introduced so that tris(dimethylamino)silane combined with ozone combined with the surfaces of the light emitting element and the base in the step (3), and then the tris(dimethylamino)silane gas was purged.

(5) An ozone gas was introduced to react ozone with the tris(dimethylamino)silane combined with oxygen in the step (4), so that ozone was combined with Si in place of amino group in the tris(dimethylamino)silane, and the ozone gas was purged.

Subsequently, the steps (4) and (5) were repeated, so that $SiO_2$ with a total thickness of 200 Å was formed, which serves as a protective film.

Comparative Example 2

In Comparative Example 2, a light emitting device was manufactured in the same manner as in Example 1 except that on a light emitting element and a base, a $SiO_2$ was formed with a thickness of 200 Å by an atomic layer deposition method to obtain a protective film in the light emitting device of Example 1.

More specifically, process described below was carried out.

(1) A film formation target with a light emitting element mounted on a base was set in a vacuum chamber of an atomic layer deposition apparatus, and the vacuum chamber was evacuated to 1 Pa. (2) The temperature of each of the light emitting element and the base was increased to 200° C.

(3) An ozone ($O_3$) gas was introduced to combine oxygen with surfaces of each of the light emitting element and the base, and then the ozone ($O_3$) gas was purged.

(4) After the ozone gas was purged, a bis(diethylamino)silane gas was introduced to react bis(diethylamino)silane with the oxygen combined with the surfaces of the light emitting element and the base, so that bis(diethylamino)silane was combined with oxygen, and then the bis(diethylamino)silane gas was purged.

(5) An ozone gas was introduced to react ozone with the bis(diethylamino)silane combined with oxygen in the step (4), so that ozone was combined with Si in place of amino group in the bis(diethylamino)silane, and then the ozone gas was purged.

Subsequently, the steps (4) and (5) were repeated, so that $SiO_2$ with a total thickness of 200 Å was formed, which serves as a protective film.

Comparative Example 3

In Comparative Example 3, a light emitting device was manufactured in substantially the same manner as in Example 1 except that, on a light emitting element and a base, $Al_2O_3$ was formed with a thickness of 200 Å by an atomic layer deposition method to obtain a protective film in the light emitting device of Example 1.

More specifically, the process described below was carried out.

(1) A film formation target with a light emitting element mounted on a base was set in a vacuum chamber of an atomic layer deposition apparatus, and the vacuum chamber was evacuated to 1 Pa.

(2) The temperature of each of the light emitting element and the base was increased to 100° C.

(3) A $H_2O$ gas was introduced to combine oxygen with surfaces of each of the light emitting element and the base, and the $H_2O$ gas was purged.

(4) A trimethylaluminum (TMA) gas was introduced to react trimethylaluminum (TMA) with the oxygen on the surfaces of each of the light emitting element and the base, and then the trimethylaluminum (TMA) gas was purged.

(5) A $H_2O$ gas was introduced to react $H_2O$ with the the trimethylaluminum (TMA) combined with oxygen in the step (4), so that oxygen was combined with aluminum in place of methyl group in the trimethylaluminum (TMA), and then the $H_2O$ gas was purged.

(6) A trimethylaluminum (TMA) gas was introduced to react trimethylaluminum (TMA) with the oxygen combined with aluminum in the step (5), and then the trimethylaluminum (TMA) gas was purged.

(7) A $H_2O$ gas was introduced to react $H_2O$ with the trimethylaluminum (TMA) combined with oxygen in the step (6), so that oxygen was combined with aluminum in place of methyl group in the trimethylaluminum (TMA), and then the $H_2O$ gas was purged.

Subsequently, the steps (6) and (7) were repeated to form $Al_2O_3$ with a total thickness of 200 Å.

Evaluation

The light emitting device of Example 1, light emitting device of Example 2, light emitting device of Comparative Example 1, light emitting device of Comparative Example 2, and light emitting device of Comparative Example 3, which were manufactured as described above, were subjected to a high-temperature and high-humidity operation test under the conditions described below.

Test Conditions
Temperature: 60° C.
Humidity: 90% RH
Forward current: 3500 mA
Evaluation Results According to the results of the test, 20% of test samples were degraded in 1000 hours in Comparative Example 1, 20% of test samples were degraded in 1700 hours in Comparative Example 2, and 20% of test samples were degraded in 2000 hours in Comparative Example 3, whereas none of test samples was degraded even at 3500 hours in Examples 1 and 2. In each example, a tris(dimethylamino)silane gas was used as a Si raw material gas, and comparing the $SiO_2$ film formed using a tris(dimethylamino)silane gas (i.e., formed in Comparative Example 1) and the $SiO_2$ film formed using a bis(diethylamino)silane gas (i.e., formed in Comparative Example 2), degradation of the semiconductor structure could be more greatly reduced with $SiO_2$ formed using a bis(diethylamino)silane gas. This indicates that, using a bis(diethylamino)silane gas allows degradation of the semiconductor structure 10a to be further reduced.

In FIG. 9, degradation that occurred in Comparative Examples 1, 2 and 3 is schematically shown.

From the results described above, it was observed that, with the protective film 18 obtained by depositing two different kinds of metal oxide films by an atomic layer deposition method in the light emitting device, degradation of the semiconductor structure 10a can be reduced.

What is claimed is:

1. A method of manufacturing a light emitting device, comprising:
   providing a light emitting element that includes:
      a semiconductor structure in which an n-type semiconductor layer, an active layer, and a p-type semiconductor layer, each containing a nitride semiconductor, are layered in this order,
      a p-electrode disposed on a portion of a surface of the p-type semiconductor layer on a side opposite to a surface provided with the active layer, and
      an n-electrode disposed on a surface of the n-type semiconductor layer on a side opposite to a surface provided with the active layer in a region other than a region facing the p-electrode,
      wherein the light emitting element has a peak wavelength of 410 nm or less; and
   forming a protective film on a surface of the light emitting element, wherein the step of forming the protective film includes:
      (i) providing a first quantity of oxygen at the surface of the light emitting element, using a first quantity of oxygen raw material gas,
      (ii) combining a first quantity of a first metal with the first quantity of oxygen provided at the surface of the light emitting element, using a first quantity of a first metal raw material gas,
      (iii) combining a second quantity of oxygen with the first quantity of the first metal combined with the first quantity of oxygen, using a second quantity of oxygen raw material gas, (iv) combining a first quantity of a second metal, different from the first metal, with the second quantity of oxygen combined with the first quantity of the first metal, using a second metal raw material gas, and (v) combining a third quantity of oxygen with the first quantity of the second metal, using a third quantity of oxygen raw material gas, wherein the protective film is formed so as to continuously cover a surface of the n-electrode and a surface of the n-type semiconductor layer.

2. The method of manufacturing a light emitting device according to claim 1, wherein the oxygen raw material gas is an ozone gas.

3. The method of manufacturing a light emitting device according to claim 1, wherein the first metal and the second metal are each selected from the group consisting of Al, Nb, Ti and Si.

4. The method of manufacturing a light emitting device according to claim 1, wherein the first metal raw material gas is a trimethylaluminum gas.

5. The method of manufacturing a light emitting device according to claim to 4, wherein the second metal raw material gas is a bis(diethylamino)silane gas.

6. The method of manufacturing a light emitting device according to claim 5, wherein, in the step of forming the protective film, the protective film is formed using a film formation temperature in a range of 200° C. to 250° C.

7. The method of manufacturing a light emitting device according to claim 1, further comprising, after sub-step (v), (vi) combining a second quantity of the first metal with the third quantity of oxygen combined with the first quantity of the second metal, using a second quantity of the first metal raw material gas, and after step (v), repeating sub-steps (vi), (iii), (iv), and (v) in this order at least one additional time.

8. The method of manufacturing a light emitting device according to claim 1, further comprising:

between sub-steps (ii) and (iii), (vii) combining a fourth quantity of oxygen to the first quantity of the first metal combined with the first quantity of oxygen, using a fourth quantity of oxygen raw material gas, and (viii) combining a second quantity of the first metal with the fourth quantity of oxygen combined with the first quantity of the first metal, using a second quantity of the first metal raw material gas, and repeating sub-steps (vii) and (viii) at least one additional time; and between sub-steps (iv) and (v), (ix) combining a fifth quantity of oxygen to the first quantity of the second metal combined with the second quantity of oxygen, using a fifth quantity of oxygen raw material gas, and (x) combining a second quantity of the second metal with the fifth quantity of oxygen combined with the first quantity of the second metal, and repeating sub-steps (ix) and (x) at least one additional time.

9. The method of manufacturing a light emitting device according to claim 1, wherein, in the step of providing the light emitting element, the light emitting element includes a p-side protective film on the surface of the p-type semiconductor layer on the side opposite to the surface provided with the active layer in a region facing the p-electrode.

10. The method of manufacturing a light emitting device according to claim 9, further comprising:

after the step of providing the light emitting element and before the step of forming the protective layer:

mounting the light emitting element to a base that includes a p-side electrode layer and an n-side electrode layer such that the p-side electrode layer and the p-electrode are connected, and connecting the n-electrode and the n-side electrode layer via a wire, wherein, in the step of forming the protective film, the protective film is formed to continuously cover a surface of the n-electrode and a surface of the n-type semiconductor layer.

11. The method of manufacturing a light emitting device according to claim 10, wherein:

in the step of providing the light emitting element, the base includes a recess, and the method further comprises, after the step of forming the protective film, fixing a cover so as to close an opening of the recess of the base.

12. The method of manufacturing a light emitting device according to claim 11, wherein, in the step of fixing the cover, the cover is fixed to the base such that a gas is present between the light emitting element and the base.

13. The method of manufacturing a light emitting device according to claim 9, wherein, in the step of providing the light emitting element, $SiO_2$ is used for the p-side protective film.

* * * * *